US012394590B2

(12) United States Patent
Yang et al.

(10) Patent No.: US 12,394,590 B2
(45) Date of Patent: Aug. 19, 2025

(54) LIQUID CELL FOR ELECTRON MICROSCOPE AND MANUFACTURING METHOD THEREOF

(71) Applicants: DAEGU GYEONGBUK INSTITUTE OF SCIENCE & TECHNOLOGY, Daegu (KR); SEOUL NATIONAL UNIVERSITY R&DB FOUNDATION, Seoul (KR)

(72) Inventors: Jiwoong Yang, Daegu (KR); Jungwon Park, Seoul (KR); Hyeonjong Ma, Jeju-si (KR)

(73) Assignees: Daegu Gyeongbuk Institute of Science and Technology, Daegu (KR); Seoul National University R&DB Foundation, Seoul (KR)

( * ) Notice: Subject to any disclaimer, the term of this patent is extended or adjusted under 35 U.S.C. 154(b) by 423 days.

(21) Appl. No.: 17/956,276

(22) Filed: Sep. 29, 2022

(65) Prior Publication Data

US 2024/0038487 A1    Feb. 1, 2024

(30) Foreign Application Priority Data

Jul. 27, 2022  (KR) .......................... 10-2022-0093229

(51) Int. Cl.
*H01J 37/26*  (2006.01)
*H01J 37/05*  (2006.01)
*H01J 37/20*  (2006.01)

(52) U.S. Cl.
CPC ............ *H01J 37/261* (2013.01); *H01J 37/05* (2013.01); *H01J 37/20* (2013.01)

(58) Field of Classification Search
CPC .......... H01J 37/261; H01J 37/05; H01J 37/20; H01J 2237/2003; H01J 37/28
See application file for complete search history.

(56) References Cited

U.S. PATENT DOCUMENTS 7,554,099 B2    6/2009  Chao et al.
9,786,469 B2 *  10/2017 Wang .................... H01J 37/261
(Continued)

FOREIGN PATENT DOCUMENTS

JP      2007-163447 A    6/2007
KR      101971825 B1     4/2019
(Continued)

OTHER PUBLICATIONS

Daniel J. Kelly et al. "In Situ TEM Imaging of Solution-Phase Chemical Reactions Using 2D- Heterostructure Mixing Cells" *Adv. Mater.* 2021, 33, 2100668 p. 1-8.
Jong Min Yuk et al. "High-Resolution EM of Colloidal Nanocrystal Growth Using Graphene Liquid Cells" Science Mag, vol. 336, Apr. 6, 2012.
(Continued)

*Primary Examiner* — David A Vanore
(74) *Attorney, Agent, or Firm* — Harness, Dickey & Pierce, P.L.C.

(57) ABSTRACT

Provided is a liquid cell for an electron microscope according to an embodiment of the inventive concept, including a lower window layer, an upper window layer above the lower window layer, and a separation film disposed between the upper window layer and the lower window layer so as to separate the upper window layer and the lower window layer from each other. An upper space may be defined by the upper window layer and the separation film, and a lower space may be defined by the lower window layer and the separation film. The upper window layer, the lower window layer, and the separation film may include the same material.

17 Claims, 11 Drawing Sheets
(1 of 11 Drawing Sheet(s) Filed in Color)

(56) References Cited

U.S. PATENT DOCUMENTS

| | | | |
|---|---|---|---|
| 10,598,609 B2* | 3/2020 | Yu | H01J 37/16 |
| 2010/0193398 A1* | 8/2010 | Marsh | H01J 37/20 |
| | | | 29/428 |
| 2010/0276277 A1* | 11/2010 | Chey | G01N 27/416 |
| | | | 204/242 |
| 2012/0120226 A1* | 5/2012 | de Jonge | H01J 37/20 |
| | | | 348/80 |
| 2012/0182548 A1* | 7/2012 | Harb | G01N 21/05 |
| | | | 156/182 |
| 2012/0298883 A1* | 11/2012 | Grogan | H01J 37/28 |
| | | | 156/60 |
| 2014/0042318 A1* | 2/2014 | Yaguchi | H01J 37/20 |
| | | | 250/311 |
| 2017/0348687 A1* | 12/2017 | Liddle | H01L 21/3065 |
| 2020/0240933 A1 | 7/2020 | Yuk et al. | |
| 2023/0025535 A1* | 1/2023 | Van Deursen | G01N 1/2813 |
| 2024/0038487 A1* | 2/2024 | Yang | H01J 37/20 |

FOREIGN PATENT DOCUMENTS

| | | |
|---|---|---|
| KR | 10-2020-0092549 A | 8/2020 |
| KR | 10-2022-0012822 A | 2/2022 |

OTHER PUBLICATIONS

Hyun Woo Cha et al. "In Situ Observation of the Early Stages of Rapid Solid-Liquid Reaction in Closed Liquid Cell TEM Using Graphene Encapsulation" Microscopy and Microanalysis (2022), 28, 53-60.

Byung Hyo Kim et al. "Liquid-Phase Transmission Electron Microscopy for Studying Colloidal Inorganic Nanoparticles" *Adv. Mater.* 2018, 30, 1703316.

Michael H. Nielsen et al. "In situ TEM imaging of CaCO3 nucleation reveals coexistence of direct and indirect pathways" Science Mag, Sep. 5, 2014 • vol. 345 Issue 6201.

* cited by examiner

LIQUID CELL FOR ELECTRON MICROSCOPE AND MANUFACTURING METHOD THEREOF

CROSS-REFERENCE TO RELATED APPLICATIONS

This U.S. non-provisional patent application claims priority under 35 U.S.C. § 119 of Korean Patent Application No. 10-2022-0093229, filed on Jul. 27, 2022, the entire contents of which are hereby incorporated by reference.

BACKGROUND

The present disclosure herein relates to a liquid cell for an electron microscope and a manufacturing method thereof, and more particularly, to a liquid cell for an electron microscope, which includes a separation film, and a manufacturing method of the liquid cell.

A transmission electron microscope (TEM) is a kind of an electron microscope, and is a microscope using an electron beam and an electron lens. Since the resolving power of the TEM is much superior to that of an optical microscope, the TEM may enlarge the image of a specimen at high magnification to observe the specimen and may be used for analyzing even a chemical composition of the specimen. According to such characteristics, the TEM is applied in the fields of materials science, chemistry, etc., and may be said to be an essential device in observation of new materials or nanomaterials.

A liquid cell for an electron microscope may be used for observing a chemical reaction of liquid materials or nanomaterials in a liquid material. When a silicon chip-based liquid cell is used, a window layer and a liquid in the liquid cell are each formed to be relatively thick so that the resolution of images finally obtained from the electron microscope is reduced.

SUMMARY

The present disclosure provides a liquid cell for an electron microscope, with which an initial stage of a chemical reaction of nanomaterials may be observed.

An embodiment of the inventive concept provides a liquid cell for an electron microscope, including a lower window layer, an upper window layer above the lower window layer, and a separation film which is disposed between the upper window layer and the lower window layer to separate the upper window layer and the lower window layer from each other. An upper space may be defined by the upper window layer and the separation film, and a lower space may be defined by the lower window layer and the separation film. The upper window layer, the lower window layer, and the separation film may include the same material.

In an embodiment of the inventive concept, a manufacturing method of a liquid cell for an electron microscope includes applying a first liquid material onto a lower window layer, disposing a metal substrate having a separation film deposited thereon on the first liquid material so that the first liquid material is supported by the separation film and the lower window layer, immersing the metal substrate in a solution to selectively remove the metal substrate, applying a second liquid material onto the separation film, and disposing an upper window layer on the second liquid material so that the second liquid material is supported by the separation film and the upper window layer. The upper window layer, the lower window layer, and the separation film may include the same material.

BRIEF DESCRIPTION OF THE FIGURES

The patent or application file contains at least one drawing executed in color. Copies of this patent or patent application publication with color drawing(s) will be provided by the Office upon request and payment of the necessary fee.

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
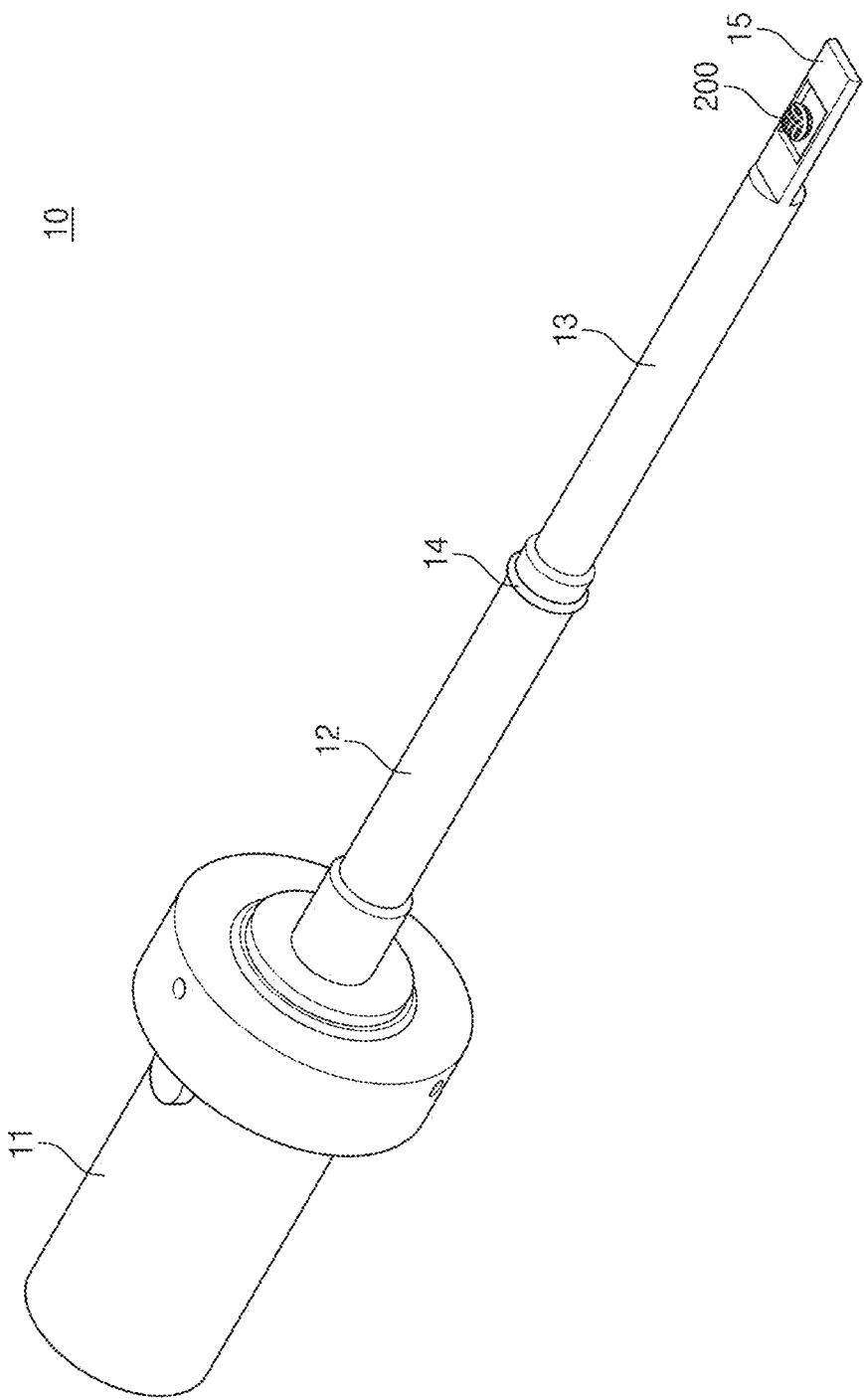
FIG. 1 is a perspective view of a holder for an electron microscope on which a liquid cell according to embodiments of the inventive concept is disposed.

FIG. 1 is a perspective view of a holder for an electron microscope on which a liquid cell according to embodiments of the inventive concept is disposed.

Referring to FIG. 1, a holder 10 for an electron microscope may include a handle part 11, an outer support rod 12, an inner support rod 13, an o-ring 14, and a specimen stage 15.

The holder 10 for an electron microscope may be inserted into an insertion port or barrel of an electron microscope (TEM) or the like. The holder 10 for an electron microscope may include the handle part 11. Although not illustrated, a controller (not illustrated) may be connected to the handle part 11. The controller may serve to control the temperature of a specimen, enter experimental data, etc. into the electron microscope, or operate the holder 10 for an electron microscope when an internal vacuum degree of the barrel of the electron microscope is a predetermined pressure or less. The handle part 11 may serve as a handle for inserting the holder 10 for an electron microscope into the electron microscope.

The outer support rod 12 and the inner support rod 13 may each extend from the handle part 11. The outer support rod 12 may be more adjacent to the handle part 11 than the inner support rod 13. The inner support rod 13 may be a part that is inserted into the insertion port or barrel of the electron microscope. The outer support rod 12 may be a part that is exposed to the outside without being inserted into the insertion port or barrel of the electron microscope.

The o-ring 14 may be disposed near a portion at which the outer support rod 12 and the inner support rod 13 are coupled to each other. That is, the o-ring 14 may be disposed at an end portion of the inner support rod 13. In one example, the o-ring 14 may surround the outer support rod 12. Unlike what is illustrated, the o-ring 14 may surround the inner support rod 13. When the inner support rod 13 is inserted into the insertion port or barrel of the electron microscope, the o-ring 14 may prevent outer air from flowing into the barrel of the electron microscope so that the outer support rod 12 and the inner support rod 13 are more tightly sealed.

The specimen stage 15 may extend from the inner support rod 13. A specimen to be observed through the electron microscope may be disposed on the specimen stage 15. A groove may be formed in the specimen stage 15 so that the specimen is properly disposed. The specimen may be mounted in the groove.

The specimen stage 15 may be disposed in the insertion port or barrel of the electron microscope so as to be irradiated with the electron beam from an electron beam irradiator in the electron microscope. In one example, a liquid cell 200 for an electron microscope may be disposed on the specimen stage 15. A liquid material may be supported in the liquid cell 200. Hereinafter, the liquid cell 200 for an electron microscope according to embodiments of the inventive concept will be described in more detail.

Figure 2:
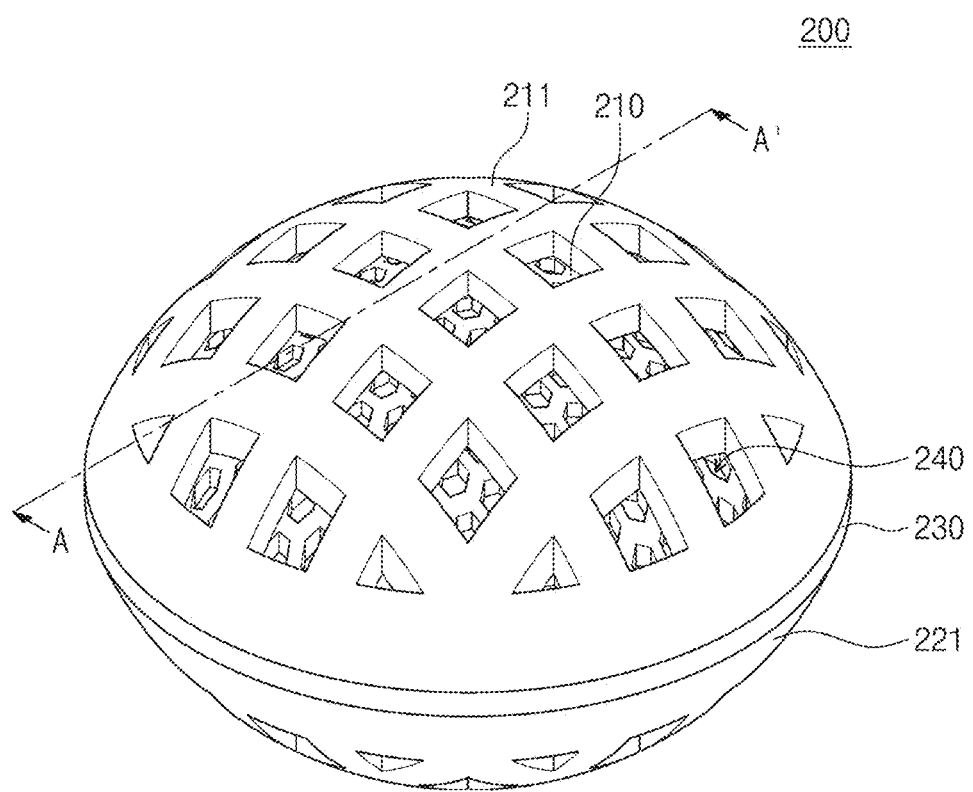
FIG. 2 is a perspective view of a liquid cell for an electron microscope according to embodiments of the inventive concept.
Figure 3:
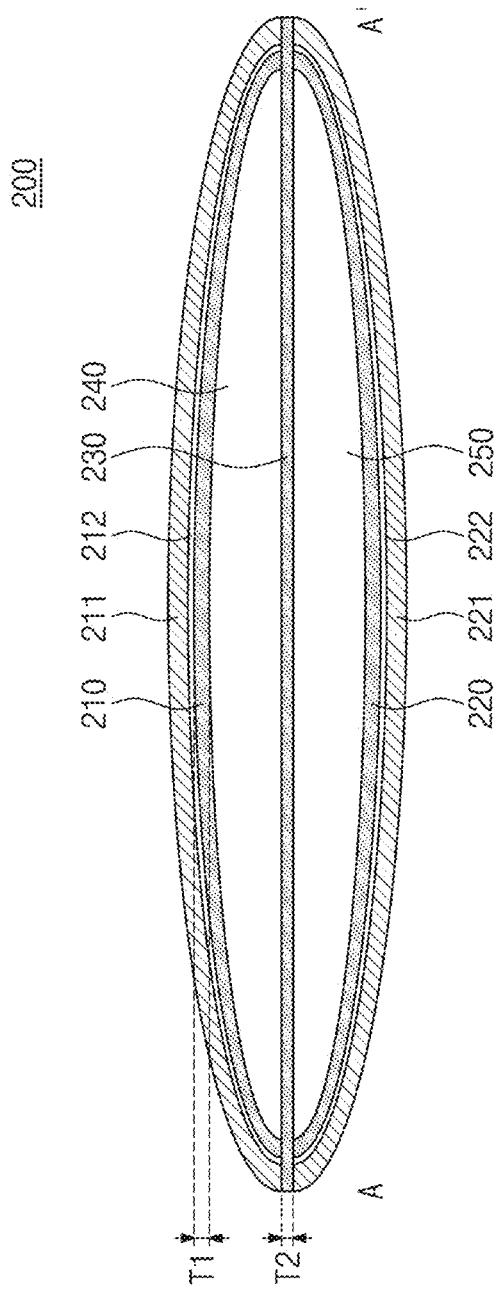
FIG. 3 is a cross-sectional view taken along line A-A' in FIG. 2.

FIG. 2 is a perspective view of a liquid cell according to embodiments of the inventive concept. FIG. 3 is a cross-sectional view taken along line A-A' in FIG. 2. The liquid cell for an electron microscope will be described in more detail with reference to FIGS. 2 and 3.

Referring to FIGS. 2 and 3, the liquid cell 200 for an electron microscope may include an upper window layer 210, a lower window layer 220, a separation film 230, an upper grating layer 211, an upper film layer 212, a lower grating layer 221, and a lower film layer 222.

The liquid cell 200 for an electron microscope may include the upper window layer 210, the lower window layer 220, and the separation film 230. The separation film 230 may be disposed between the upper window layer 210 and the lower window layer 220. The liquid cell 200 may be divided into two spaces by the separation film 230. That is, the liquid cell 200 may be divided into an upper space, which is defined by the upper window layer 210 and the separation film 230, and a lower space which is defined by the lower window layer 220 and the separation film 230. The upper space and the lower space may face each other with respect to the separation film 230. The electron beam emitted from the electron microscope may be delivered to the specimen in the liquid cell 200 through the upper window layer 210 and the lower window layer 220.

The upper window layer 210 and the lower window layer 220 may include the same material. In one example, the upper window layer 210 and the lower window layer 220 may each include graphene. The upper window layer 210 and the lower window layer 220 may each include multi-layer graphene. For example, the upper window layer 210 and the lower window layer 220 may each include graphene in which single-atom layers are stacked in two layers to about ten layers. The upper window layer 210 and the lower window layer 220 may be composed of graphene to achieve a microscope image with higher resolution than a window layer using silicone nitride, silicone, or the like.

The upper window layer 210 and the lower window layer 220 may each have a first thickness T1. The first thickness T1 may be about 0.6 nm to about 30 nm. In another example, the thickness of the upper window layer 210 may be different from the thickness of the lower window layer 220. The upper window layer 210 and the lower window layer 220 may each have a convex shape. In another example, the upper window layer 210 and the lower window layer 220 may each have a relatively flat shape.

The separation film 230 may be disposed between the upper window layer 210 and the lower window layer 220. The separation film 230 may physically separate the upper window layer 210 and the lower window layer 220. The separation film 230 may include the same material as at least one of the upper window layer 210 or the lower window layer 220. In one example, the separation film 230 may include graphene.

The separation film 230 may include a single- or multi-layer graphene or graphene oxide. In one example, the separation film 230 may include a single-, bi-, or tri-layer graphene or graphene oxide. The separation film 230 may have a second thickness T2. The second thickness T2 may be smaller than the first thickness T1. In one example, the second thickness T2 may be about 0.3 nm to about 2 nm. Although will be described later, the first thickness T1 is greater than the second thickness T2 so that the upper window layer 210 and the lower window layer 220 may not be collapsed by the electron beam emitted from the electron microscope and the separation film 230 alone may be collapsed by the electron beam. Accordingly, although will be described later, an initial chemical reaction of the nanomaterials included in the liquid material may be controlled.

The separation film 230 may have a flat shape. However, the shapes of the upper window layer 210, the lower window layer 220, and the separation film 230 are not limited to those illustrated in FIGS. 2 and 3, and may be freely changed. For example, the separation film 230 may also have a shape that is convex toward one direction, and the upper window layer 210 or the lower window layer 220 may each have a relatively flat shape when compared to the separation film 230.

The upper grating layer 211 may be disposed on the upper window layer 210. The upper grating layer 211 may have a grating structure. The upper film layer 212 may be interposed between the upper grating layer 211 and the upper window layer 210. The upper film layer 212 may be deposited on the upper grating layer 211. The upper grating layer 211 may include a metal material. In one example, the upper grating layer 211 may include at least one of copper (Cu), nickel (Ni), gold (Au), molybdenum (Mo), aluminum (Al), or titanium (Ti). Specifically, the upper grating layer 211 may include copper (Cu). The upper film layer 212 may include carbon (C). The upper window layer 210 may be transferred onto the upper film layer 212. The upper grating layer 211 and the upper film layer 212 may constitute a TEM grid. The upper grating layer 211 and the upper film layer 212 may each have a relatively small thickness and thus have flexibility.

The lower grating layer 221 may be disposed on the lower window layer 220. The lower grating layer 221 may have a grating structure. The lower film layer 222 may be interposed between the lower grating layer 221 and the lower window layer 220. The lower film layer 222 may be deposited on the lower grating layer 221. The lower grating layer 221 may include a metal material. In one example, the lower grating layer 221 may include the same material as the upper grating layer 211. The lower film layer 222 may include carbon (C). The lower window layer 220 may be transferred onto the lower film layer 222. The lower grating layer 221 and the lower film layer 222 may constitute a TEM grid. The lower grating layer 221 and the lower film layer 222 may each have a relatively small thickness and thus have flexibility.

A first liquid material 240 may be supported in the upper space between the upper window layer 210 and the separation film 230. A second liquid material 250 may be supported in the lower space between the lower window layer 220 and the separation film 230. That is, different liquid materials may be supported in different spaces in the liquid cell, respectively.

At least one of the first liquid material 240 or the second liquid material 250 may include nanomaterials (nanoparticles). In one example, the first liquid material 240 may include an acid solution (e.g., aqua regia), and the second liquid material 250 may include gold nanoparticles dissolved in water. In another example, the first liquid material 240 may include water, and the second liquid material 250 may include CdS semiconductor nanoparticles dissolved in an organic solvent (e.g., hexadecylamine, etc.).

Figure 4:
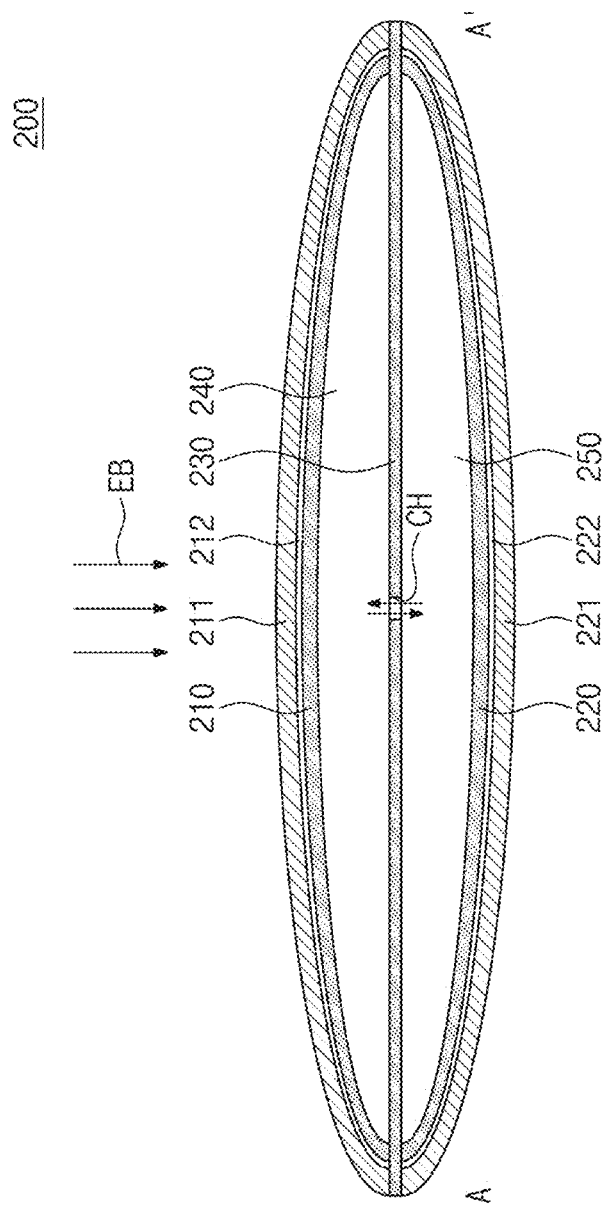
FIG. 4 is a cross-sectional view illustrating a liquid cell structure when the liquid cell in FIG. 3 is irradiated with an electron beam of an electron microscope.

FIG. 4 is a cross-sectional view illustrating a liquid cell structure when the liquid cell in FIG. 3 is irradiated with an electron beam.

Referring to FIG. 4, the liquid cell 200 for an electron microscope may be disposed on the specimen stage 15 of the holder 10 for an electron microscope, and then inserted into the insertion port or barrel of the electron microscope such as TEM (see FIG. 1). An electron beam EB may be emitted toward the liquid cell 200 from the electron beam irradiator in the electron microscope. The electron beam EB may have energy of, for example, about 200 keV to about 1000 keV. As a portion of the separation film 230 is collapsed by the electron beam EB, a channel CH may be formed between the upper space and the lower space of the liquid cell 200. A voltage higher than a knock-on voltage (about 100 keV) of graphene is applied by the electron beam EB so that the portion of the separation film 230 composed of graphene may be collapsed. Accordingly, the first liquid material 240 and the second liquid material 250, which have been supported in the different spaces, may move through the channel CH so as to be mixed with each other. Accordingly, the nanomaterials in the liquid material may chemically react with a solution or different nanomaterials. Since the thickness of the separation film 230 is relatively small when compared to the thickness of the upper window layer 210 or the lower window layer 220, the upper window layer 210 and the lower window layer 220 may not be collapsed by the electron beam and the separation film 230 alone may be collapsed by the electron beam. Consequently, a chemical reaction may be stably initiated between the nanomaterials dissolved in the liquid material and the other liquid material.

A liquid cell of a typical electron microscope is not provided with a separation film so that a solution and nanomaterials, or nanomaterials different from each other, are simultaneously provided to a single space in the liquid cell. In this case, an initiation time for the chemical reaction may not be controlled, and it is difficult to observe, through an electron microscope, an initial stage of the chemical reaction of the nanomaterials, because the chemical reaction of the nanomaterials has been already initiated.

According to an embodiment of the inventive concept, a portion of the separation film of the liquid cell is collapsed by the electron beam emitted from the electron microscope so that the first liquid material and the second liquid material, which are supported in the different spaces in the liquid cell, may be mixed with each other. Accordingly, the chemical reaction of the nanomaterials included in the liquid material may be initiated. That is, according to an embodiment of the inventive concept, the initiation time for the chemical reaction of the nanomaterials may be controlled through the irradiation with the electron beam. Consequently, it becomes easier to observe, through the electron microscope, the initial stage of the chemical reaction of the nanomaterials.

FIGS. 5A to 5D are cross-sectional views illustrating a manufacturing method of a liquid cell according to embodiments of the inventive concept.

Figure 5A:
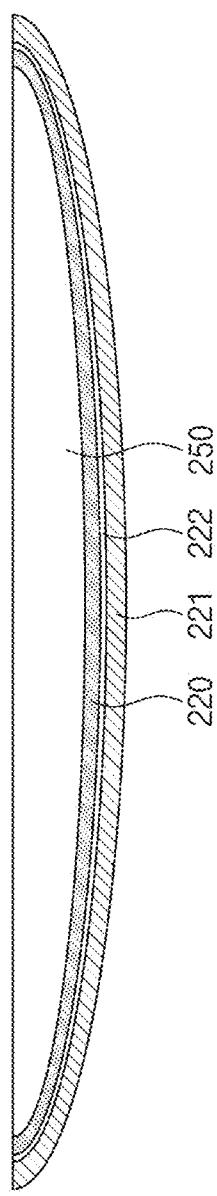
FIGS. 5A to 5D are cross-sectional views illustrating a manufacturing method of a liquid cell for an electron microscope according to embodiments of the inventive concept.

Referring to FIG. 5A, the lower window layer 220 may be transferred onto the lower grating layer 221, on which the lower film layer 222 is deposited, i.e., TEM grid. The lower window layer 220 may include, for example, graphene. The lower window layer 220 may include two- to about ten-layer graphene. The second liquid material 250 may be applied onto the lower window layer 220. The second liquid material 250 may include, for example, nanomaterials (nanoparticles) therein. The lower grating layer 221 and the lower film layer 222 may each have a relatively small thickness and thus have flexibility. Accordingly, the lower grating layer 221, the lower film layer 222, and the lower window layer 220 may be stretchable due to the surface tension of the second liquid material 250.

Figure 5B:
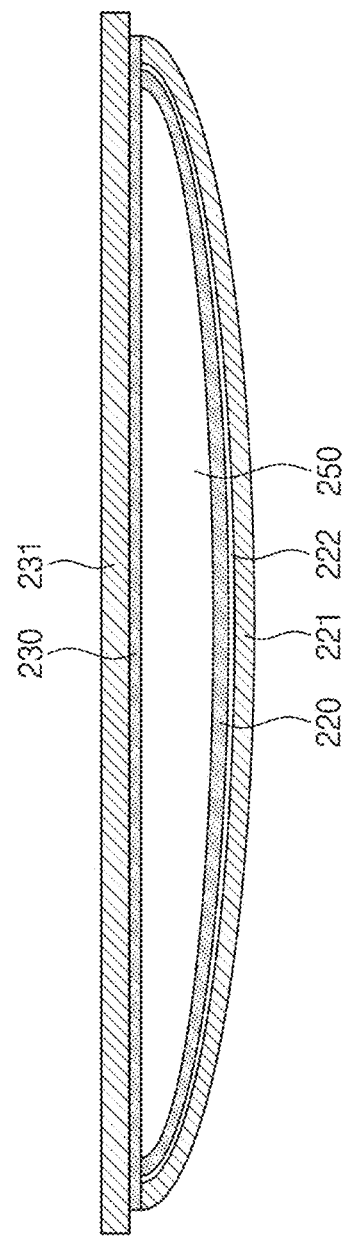

Referring to FIG. 5B, the separation film 230 may be deposited on a metal substrate 231. In one example, the metal substrate 231 may include copper (Cu), and the separation film 230 may include graphene or graphene oxide. The separation film 230 may include single- to tri-layer graphene or graphene oxide. In one example, the separation film 230 may have a smaller thickness than the lower window layer 220.

The metal substrate 231 having the separation film 230 deposited thereon may be disposed in a direction toward the second liquid material 250 and superimposed on the second liquid material 250. That is, the second liquid material 250 may be covered by the metal substrate 231 and the separation film 230. Accordingly, the second liquid material 250 may be supported between the separation film 230 and the lower window layer 220.

Figure 5C:
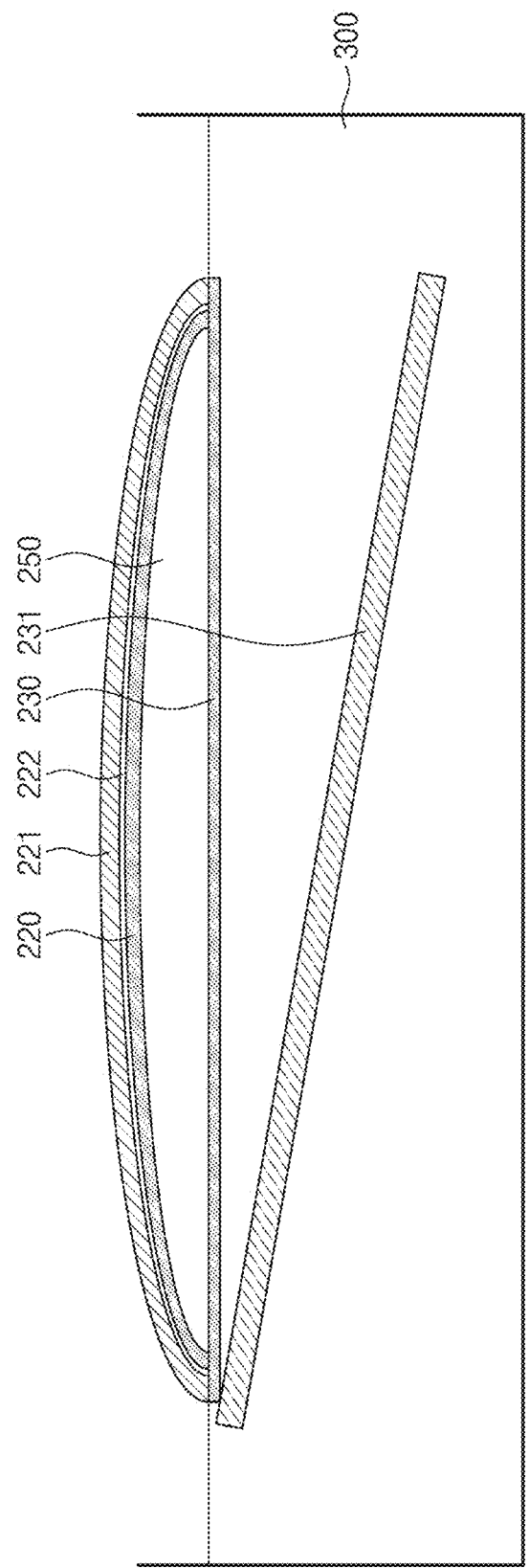

Referring to FIG. 5C, the resultant product in FIG. 5B may be immersed in a solution 300. In one example, the solution 300 may include ammonium persulfate. The solution 300 may selectively dissolve the metal substrate 231 including copper (Cu). That is, the metal substrate 231 may be removed by the solution 300, and the separation film 230 may remain on the second liquid material 250. The solution 300 is not limited to said material as long as a material may selectively remove the metal substrate 231 including copper (Cu). Consequently, the second liquid material 250 may be supported in the lower space defined by the separation film 230 and the lower window layer 220.

Figure 5D:
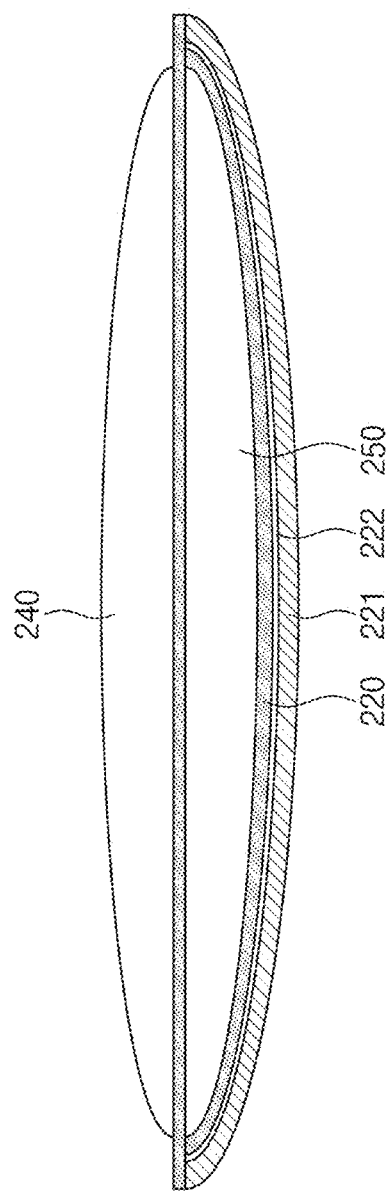

Referring to FIG. 5D, the first liquid material 240 may be applied onto the remaining separation film 230. In one example, the first liquid material 240 may include nanomaterials (nanoparticles). For example, the first liquid material 240 may include nanomaterials different from the nanomaterials included in the second liquid material 250. In another example, the first liquid material 240 may not include nanomaterials, and the second liquid material 250 may include nanomaterials therein.

Referring to FIGS. 2 and 3 again, the upper window layer 210 may be transferred onto the upper grating layer 211, on which the upper film layer 212 is deposited, i.e., TEM grid. The upper window layer 210 may include, for example, graphene. For example, the upper window layer 210 may include two- to about ten-layer graphene. The upper grating layer 211 and the upper film layer 212 may each have a relatively small thickness and thus have flexibility. Accordingly, the upper grating layer 211, the upper film layer 212, and the upper window layer 210 may be stretchable due to the surface tension of the first liquid material 240. Consequently, the liquid cell 200 described with reference to FIGS. 2 and 3 may be manufactured.

Figure 6:
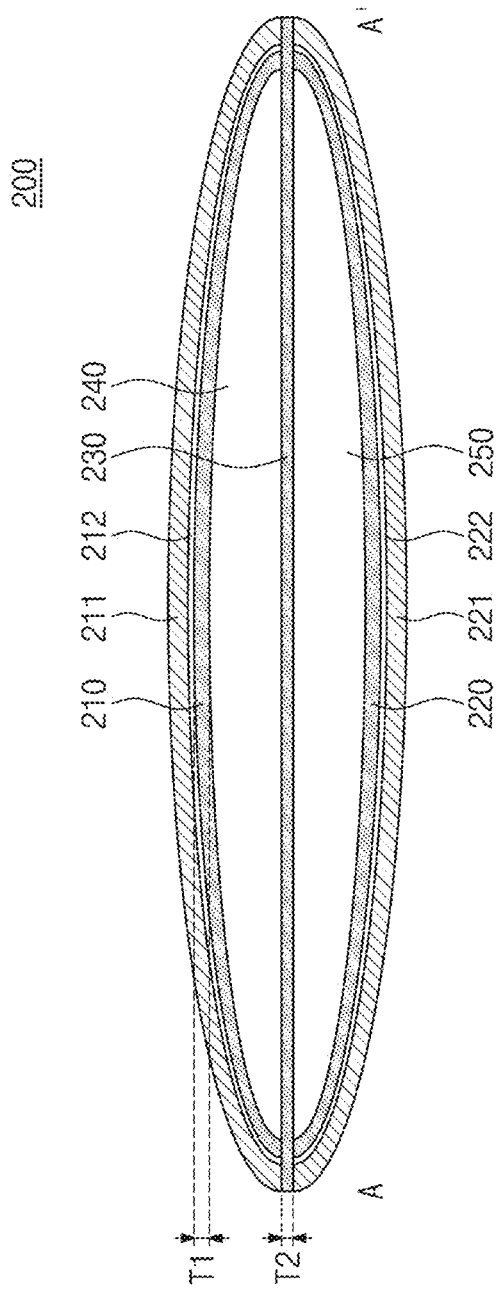
FIG. 6 is a cross-sectional view taken along line A-A' in FIG. 2, which illustrates the liquid cell for an electron microscope according to embodiments of the inventive concept.

FIG. 6 is a cross-sectional view taken along line A-A' in FIG. 2, which illustrates the liquid cell according to embodiments of the inventive concept. In this embodiment, the contents in common with those described with reference to FIGS. 2 and 3 will be omitted, and differences will be described in detail.

Referring to FIG. 6, the first thickness T1 and the second thickness T2 may be substantially the same as each other. In one example, the upper window layer 210 and the lower window layer 220 may each include tri-layer graphene. Here, the separation film 230 needs to have a smaller thickness than a window so that even when the separation film 230 is decomposed, the upper window layer 210 and the lower window layer 220, unlike the separation film 230, may not be collapsed by the electron beam emitted from the electron microscope. This is because the upper window layer 210 is attached to the upper film layer 212 including carbon (C) and the lower window layer 220 is attached to the lower film layer 222 including carbon (C). That is, due to an attraction force between the graphene of the upper window layer 210 and the upper film layer 212, and an attraction force between the graphene of the lower window layer 220 and the lower film layer 222, the upper window layer 210 and the lower window layer 220, unlike the separation film 230, may not be collapsed even by the electron beam emitted from the electron microscope.

Figure 7:
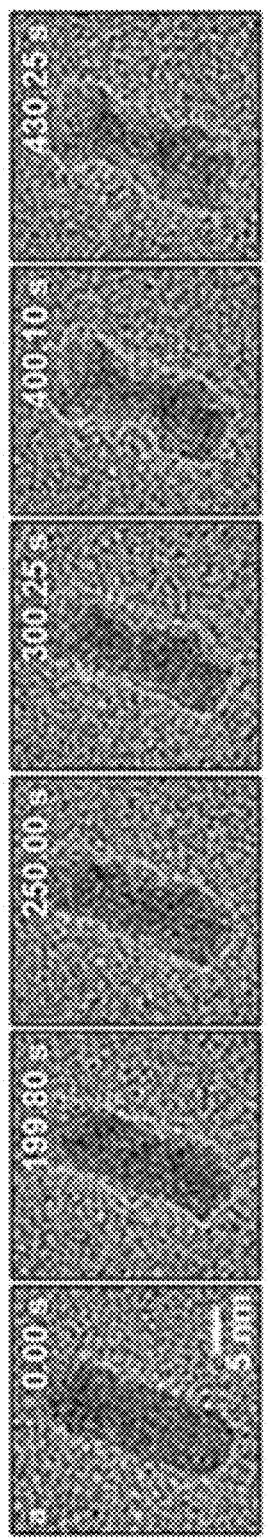
FIG. 7 shows images of results over time obtained by observing a CdS nanoparticle modification process caused by water, using the liquid cell according to embodiments of the inventive concept.

FIG. 7 shows images of results over time obtained by observing a CdS nanoparticle modification process caused by water, using the liquid cell according to embodiments of the inventive concept. Specifically, FIG. 7 shows images obtained by observing the chemical reaction occurring after the electron beam is emitted onto the liquid cell in which the first liquid material includes water and the second liquid material includes CdS nanoparticles dissolved in an organic solvent.

Figure 8:
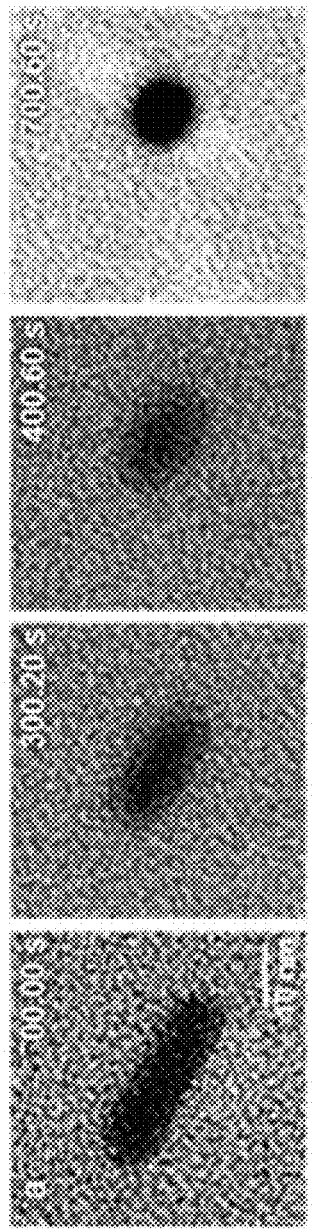
FIG. 8 shows images of results over time obtained by observing a gold nanoparticle removal process caused by an acid solution, using the liquid cell according to embodiments of the inventive concept.

FIG. 8 shows images of results over time obtained by observing a gold nanoparticle removal process caused by an acid solution, using the liquid cell according to embodiments of the inventive concept. Specifically, FIG. 8 show images obtained by observing the chemical reaction occurring after the electron beam is emitted onto the liquid cell in which the first liquid material includes an acid solution and the second liquid material includes gold nanomaterials dissolved in water.

Referring to FIGS. 7 and 8, it may be confirmed that it is possible to observe, through the electron microscope, images with high resolution starting from the initial chemical reaction of the nanomaterials. That is, it may be confirmed that it is possible to achieve the image with high resolution, which is an advantage of the liquid cell composed of the graphene, and provide the separation film to be collapsed by the electron beam so as to observe the chemical reaction at the initial stage of the nanomaterials.

Figure 9:
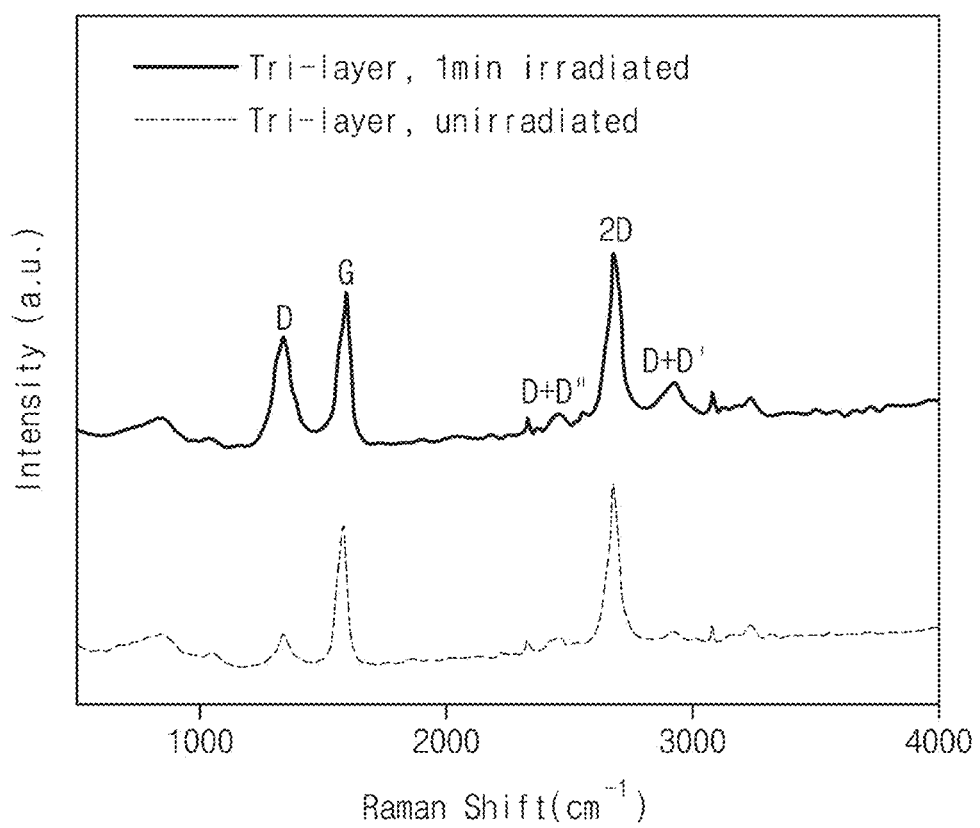
FIG. 9 shows an image obtained by measuring Raman spectral changes through a Raman spectroscopy when a separation film of the liquid cell according to embodiments of the inventive concept is irradiated and unirradiated with an electron beam.

FIG. 9 shows an image obtained by measuring Raman spectral changes through a Raman spectroscopy when the separation film of the liquid cell according to embodiments of the inventive concept is irradiated and unirradiated with an electron beam.

Referring to FIG. 9, when the separation film is irradiated with the electron beam for about one minute (1 min irradiated), changes in peak D+D' and peak D+D" were detected from the separation film composed of graphene. Before the irradiation with the electron beam, simply Raman spectra for crystalline graphene were detected, but after the irradiation with the electron beam, amorphous graphene was detected. In other words, it may be confirmed that the crystalline graphene of the separation film was partially collapsed by the electron beam. That is, a channel may be formed between the upper space and the lower space so that the first liquid material and the second liquid material are mixed with each other through the channel.

Figure 10:
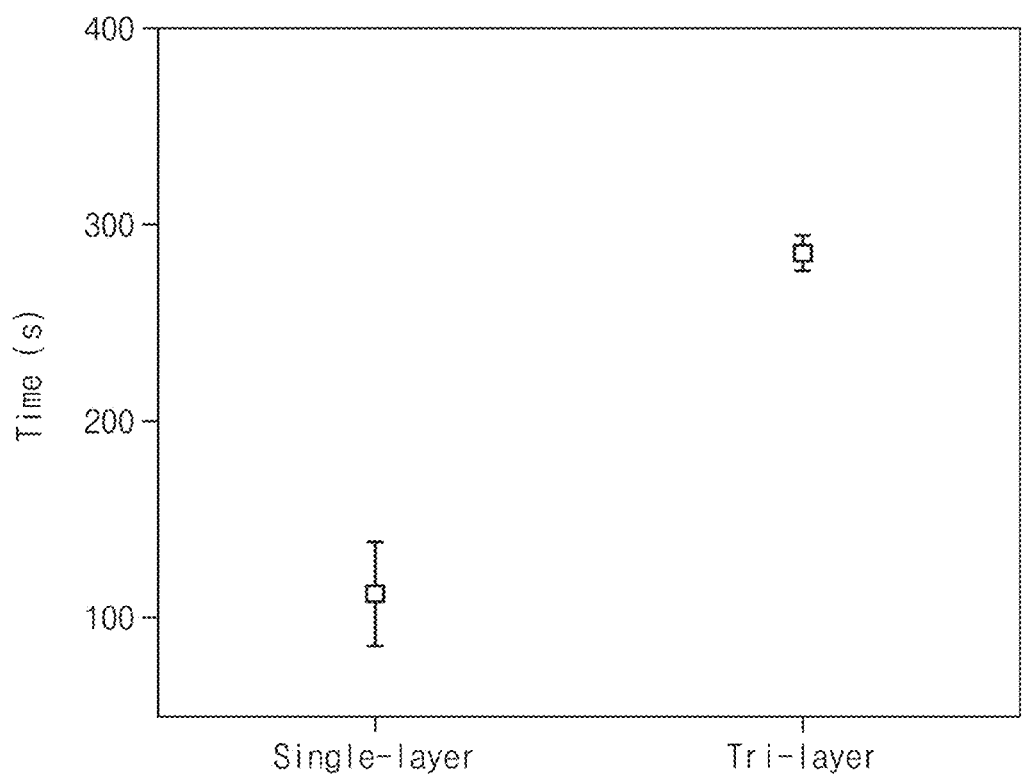
FIG. 10 is a graph showing a time required for a chemical reaction between a solution and nanomaterials depending on a thickness of the separation film of the liquid cell according to embodiments of the inventive concept.

FIG. 10 is a graph showing a time required for a chemical reaction between a solution and nanomaterials depending on a thickness of the separation film of the liquid cell according to embodiments of the inventive concept. Specifically, when the first liquid material includes water and the second liquid material includes CdS nanoparticles dissolved in an organic solvent, an average time was measured which was taken to chemically react the water with the CdS nanoparticles starting from irradiating the separation film with the electron beam.

Referring to FIG. 10, when the separation film of the liquid cell according to embodiments of the inventive concept is composed of tri-layer graphene, the average time taken to chemically react the water with the CdS nanoparticles was relatively long, when compared to when composed of a single-layer graphene. This means that the greater the thickness of graphene, the longer the time required for being collapsed by the electron beam. That is, the thickness of the separation film of the liquid cell may be appropriately adjusted to adjust a time taken to chemically react the liquid material (solvent) with the nanoparticles.

According to the embodiment of the inventive concept, the portion of the separation film of the liquid cell may be collapsed by the electron beam emitted from the electron microscope so that the first liquid material and the second liquid material, which are supported in the different spaces in the liquid cell, are mixed with each other. Accordingly, the chemical reaction of the nanomaterials included in the liquid material may be initiated. That is, it may be possible to control, through the irradiation with the electron beam, the initiation time for the chemical reaction of the nanomaterials. Consequently, it becomes easier to observe, through the electron microscope, the initial stage of the chemical reaction of the nanomaterials.

Although the embodiments of the present invention have been described with reference to the accompanying drawings, it is understood that the present invention should not be limited to these embodiments but various changes and modifications can be made by one ordinary skilled in the art within the spirit and scope of the present invention as hereinafter claimed.

What is claimed is:

1. A liquid cell for an electron microscope, comprising:
   a lower window layer;
   an upper window layer above the lower window layer; and
   a separation film disposed between the upper window layer and the lower window layer to separate the upper window layer and the lower window layer from each other,
   wherein an upper space is defined by the upper window layer and the separation film,
   a lower space is defined by the lower window layer and the separation film, and
   the upper window layer, the lower window layer, and the separation film comprises the same material.

2. The liquid cell of claim 1, wherein the upper window layer, the lower window layer, and the separation film each comprise graphene or graphene oxide.

3. The liquid cell of claim 2, wherein the upper window layer has a greater thickness than the separation film.

4. The liquid cell of claim 1, wherein:
   a first liquid material is disposed in the upper space; and
   a second liquid material, which comprises a material different from the first liquid material, is disposed in the lower space.

5. The liquid cell of claim 1, wherein the separation film has a thickness of about 0.3 nm to about 2 nm.

6. The liquid cell of claim 1, wherein the upper window layer has a thickness of about 0.6 nm to about 30 nm.

7. The liquid cell of claim 1, wherein the upper window layer comprises bi- to eight-layer graphene.

8. The liquid cell of claim 1, wherein the separation film comprises a single- to tri-layer graphene.

9. The liquid cell of claim 1, further comprising:
   an upper grating layer disposed above the upper window layer; and
   an upper film layer interposed between the upper grating layer and the upper window layer.

10. The liquid cell of claim 9, further comprising:
    a lower grating layer disposed above the lower window layer; and
    a lower film layer interposed between the lower grating layer and the lower window layer.

11. A manufacturing method of a liquid cell for an electron microscope, the manufacturing method comprising:
    applying a first liquid material onto a lower window layer;
    disposing a metal substrate having a separation film deposited thereon on the first liquid material, so that the first liquid material is supported by the separation film and the lower window layer;
    immersing the metal substrate in a solution to selectively remove the metal substrate;
    applying a second liquid material onto the separation film; and
    disposing an upper window layer on the second liquid material so that the second liquid material is supported by the separation film and the upper window layer,
    wherein the upper window layer, the lower window layer, and the separation film comprise the same material.

12. The manufacturing method of claim 11, wherein the solution comprises ammonium persulfate.

13. The manufacturing method of claim 11, wherein the separation film has a thickness of about 0.3 nm to about 2 nm.

14. The manufacturing method of claim 13, wherein the upper window layer has a thickness of about 0.6 nm to about 30 nm.

15. The manufacturing method of claim 11, wherein the upper window layer, the lower window layer, and the separation film each comprise graphene.

16. The manufacturing method of claim 11, further comprising, before the applying of the first liquid material, transferring the lower window layer onto a lower grating layer.

17. The manufacturing method of claim 11, further comprising transferring the upper window layer onto an upper grating layer.

* * * * *